(12) United States Patent
Sorich

(10) Patent No.: US 8,017,223 B2
(45) Date of Patent: Sep. 13, 2011

(54) CONTAINMENT STRUCTURE AND METHOD

(75) Inventor: Stephen Sorich, Goleta, CA (US)

(73) Assignee: E. I. Du Pont de Nemours and Company, Wilmington, DE (US)

(*) Notice: Subject to any disclaimer, the term of this patent is extended or adjusted under 35 U.S.C. 154(b) by 82 days.

(21) Appl. No.: 11/721,589

(22) PCT Filed: Dec. 23, 2005

(86) PCT No.: PCT/US2005/047029
§ 371 (c)(1),
(2), (4) Date: Feb. 20, 2008

(87) PCT Pub. No.: WO2006/073926
PCT Pub. Date: Jul. 13, 2006

(65) Prior Publication Data
US 2008/0217644 A1    Sep. 11, 2008

Related U.S. Application Data

(60) Provisional application No. 60/640,492, filed on Dec. 30, 2004, provisional application No. 60/694,900, filed on Jun. 28, 2005.

(51) Int. Cl.
  *H01L 51/52* (2006.01)
  *H01L 51/56* (2006.01)
  *B05D 5/00* (2006.01)
(52) U.S. Cl. ............ 428/212; 257/99; 427/256; 438/34
(58) Field of Classification Search ............... 428/212; 427/256; 257/99; 438/34
See application file for complete search history.

(56) References Cited

U.S. PATENT DOCUMENTS

| | | | |
|---|---|---|---|
| 6,303,238 B1 | 10/2001 | Thompson et al. | 428/690 |
| 6,927,012 B2 * | 8/2005 | Hatanaka et al. | 430/270.1 |
| 2001/0019782 A1 | 9/2001 | Igarashi et al. | 428/690 |
| 2002/0195961 A1 * | 12/2002 | Barth et al. | 315/169.3 |
| 2004/0079940 A1 * | 4/2004 | Redecker et al. | 257/40 |

FOREIGN PATENT DOCUMENTS

| | | |
|---|---|---|
| EP | 1 191 612 A2 | 3/2002 |
| EP | 1 191 614 A2 | 3/2002 |
| WO | WO 00/70655 | 11/2000 |
| WO | WO 01/41512 A1 | 6/2001 |
| WO | WO 02/02714 A2 | 1/2002 |
| WO | WO 02/15645 A1 | 2/2002 |

OTHER PUBLICATIONS

Campbell, I. H. et al., "Excitation Transfer Processes in a Phosphor-Doped Poly (p-phenylene vinylene) Light-Emitting Diode", Physical Review B., vol. 65, 085210-1-085210-8.
Gustafsson, G. et al., "Flexible Light-Emitting Diodes made from Soluble Conducting Polymer", Nature, 1992, 357, 477-479.
O'Brien, D.F. et al., "Electrophosphoresence from a Doped Polymer Light Emitting Diode", Synthetic Metals, 2001, 116(1-3), 379-383.
Othmer, K., Encyclopedia of Chemical Technology, 1996, 18(4th Ed), 837-860.

* cited by examiner

*Primary Examiner* — David R Sample
*Assistant Examiner* — Tahseen Khan
(74) *Attorney, Agent, or Firm* — Woodcock Washburn LLP

(57) ABSTRACT

Containment structures for an organic composition, comprising a first zone having a first surface energy, and a second zone having a second surface energy different than the first surface energy, and methods for making the same.

14 Claims, 2 Drawing Sheets

CONTAINMENT STRUCTURE AND METHOD

CROSS-REFERENCE TO RELATED APPLICATIONS

This application is the National Stage of International Application No. PCT/US2005/047029, filed Dec. 23 2005, which claims the benefit of U.S. Provisional Application Nos. 60/640,492, filed Dec. 30, 2004 and 60/694,900, filed Jun. 28, 2005, the disclosures of which are incorporated herein by reference in their entireties.

FIELD

The present invention relates generally to containment structures, for example, those found in organic electronic devices, and materials and methods for fabrication of the same.

BACKGROUND

During manufacture of certain devices, for example, an organic electronic device, it may be necessary to apply a layer, or layers, of liquid organic compositions to the device within a predetermined area. One solution is to use some means of containment to prevent a liquid from leaving the predetermined area. Containment structures, often referred to as wells, are often used for this purpose, but prior containment structures were subject to certain disadvantages, such as creeping or other surface phenomena. For example, in conventional applications where no surface treatment is used, the organic composition typically wets the surface of the containment structure, causing the final thickness of the layer to be undesirably non-uniform. Contrariwise, in conventional applications where the containment structure is rendered non-wetting, if the liquid de-wets from the containment structure while the liquid viscosity is low, the final thickness of the layer is also undesirably non-uniform.

Thus, what is needed are improved containment structures.

SUMMARY

In one embodiment, the present invention includes a containment structure having a first zone having an inherent first surface energy, and a second zone having an inherent second surface energy which is different than the first surface energy, and methods for making the same.

The foregoing geheral description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

In one embodiment, the present invention includes a containment structure a containment structure having a first zone having an inherent first surface energy, and a second zone having an inherent second surface energy which is different than the first surface energy.

Figure 1:
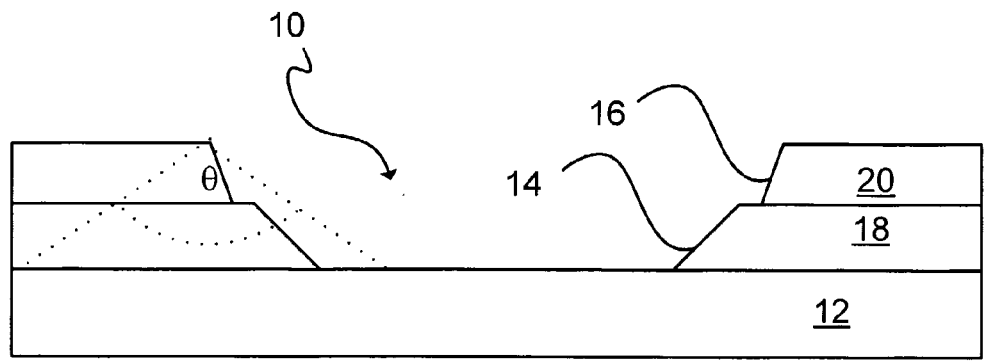
FIG. 1 is a schematic diagram of containment structure according to one embodiment of the present invention in cross-section.

Turning to FIG. 1, a containment structure 10, shown in cross-section, generally defines an area capable of substantially retaining a liquid on a substrate 12. In one embodiment, the liquid is an organic composition. In one embodiment, the liquid is used in the fabrication of an organic electronic device.

The substrate 12 serves as the bottom of the containment structure 10. The substrate 12 may be temporary or permanent, so long as it substantially prevents the liquid from escaping. In one embodiment, the substrate 12 is permanent. In one embodiment, the substrate 12 is a layer from an electronic organic device. In one embodiment, the substrate 12 is an Indium Tin Oxide (ITO) coated glass substrate.

The area capable of substantially retaining a liquid is predetermined, and may be any desired shape defined by the containment structure 10.

A first zone 14 and a second zone 16 are included in the containment structure 10. Each zone has a characteristic surface energy, and the surface energies are not identical. In one embodiment, the surface energies differ by at least 10 dynes/cm. In one embodiment, the respective bottom zone has a higher surface energy.

The first zone 14 and the second zone 16 may be discreet layers, respectively 18 and 20. In one embodiment, the layers are comprising photoresist and additives, as will be described below. It is understood that these layers experience the surface energies of their respective zones through out the layer, in other words, the surface energy is inherent. This is an improvement over layers that are laid down and later coated to create different zones, such as by fluorination, because it reduces steps and process times.

It is understood that certain embodiments contemplate any number of additional (third, fourth, fifth, etc.) zones, any of which may have surface energies identical to the first zone 14 or the second zone 16, the only requirement being that the surface energies of the first zone 14 and the second zone 16 are not identical.

Figure 2:
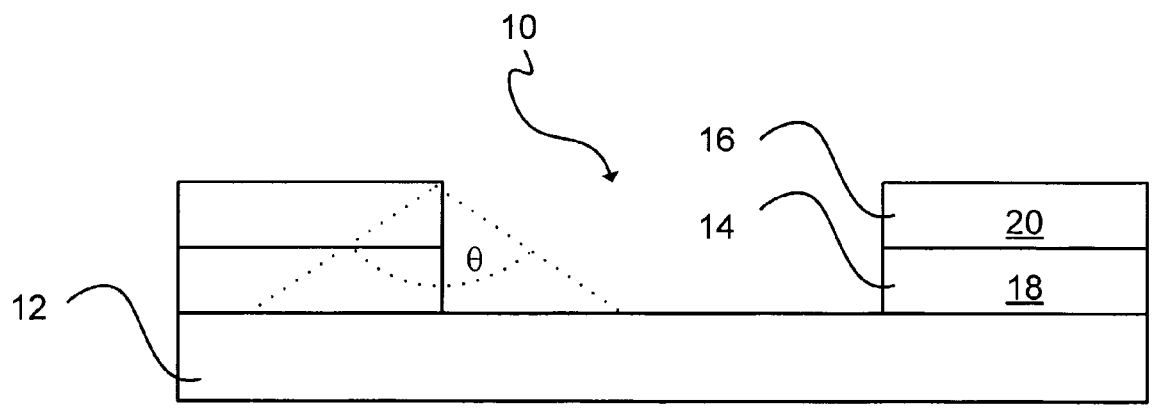
FIG. 2 is a schematic diagram of containment structure according to another embodiment of the present invention in cross-section.

Turning to FIGS. 1 and 2 together, it is understood that the sides of the containment structure 10 created by the layer(s) creating the first zone 14 and the second zone 16 have an overall angle θ which is the average of the respective angles of the first zone 14 and the second zone 16. Overall angle θ may be any number in a range from 35 degrees to 145 degrees, and all combinations and subcombinations therein, including 60 degrees to 120 degrees and 75 degrees to 105 degrees. The individual angles for the first zone 14 and the second zone 16 may be different (see FIG. 1) or the same (see FIG. 2).

In one embodiment, a method for forming the containment structure 10 includes selecting a first formulation of photoresist and additives having a first surface energy, and selecting a second formulation of photoresist and additives having a second surface energy different than the first surface energy. In one embodiment, the first formulation is deposited on a substrate to form a first portion of the containment structure, having a characteristic surface energy. A second formulation of photoresist and additives having a second surface energy is deposited on the first formulation to form a second portion of the containment structure. Additives can be mixed into a photoresist prior to processing to achieve specific surface energies. The additives include surfactants, fluoro-surfactants, silicones, siloxanes, or other surface modifiers. The wetting characteristics of the photoresist/additive formulations are known or easily determined via routine experimentation.

In another embodiment, a method for forming the containment structure 10 includes forming a containment structure, and then treating only a portion thereof to create separate zones with different surface energies. In one embodiment, a surface treatment that prevents wetting can be applied, such as by fluorinating via plasma (e.g., $CF_4$) or printing a non-wetting material onto the wall of the containment structure.

Any number of other configurations for the containment structure are contemplated.

Many aspects and embodiments have been described above and are merely exemplary and not limiting. After reading this specification, skilled artisans appreciate that other aspects and embodiments are possible without departing from the scope of the invention.

Device

Figure 3:
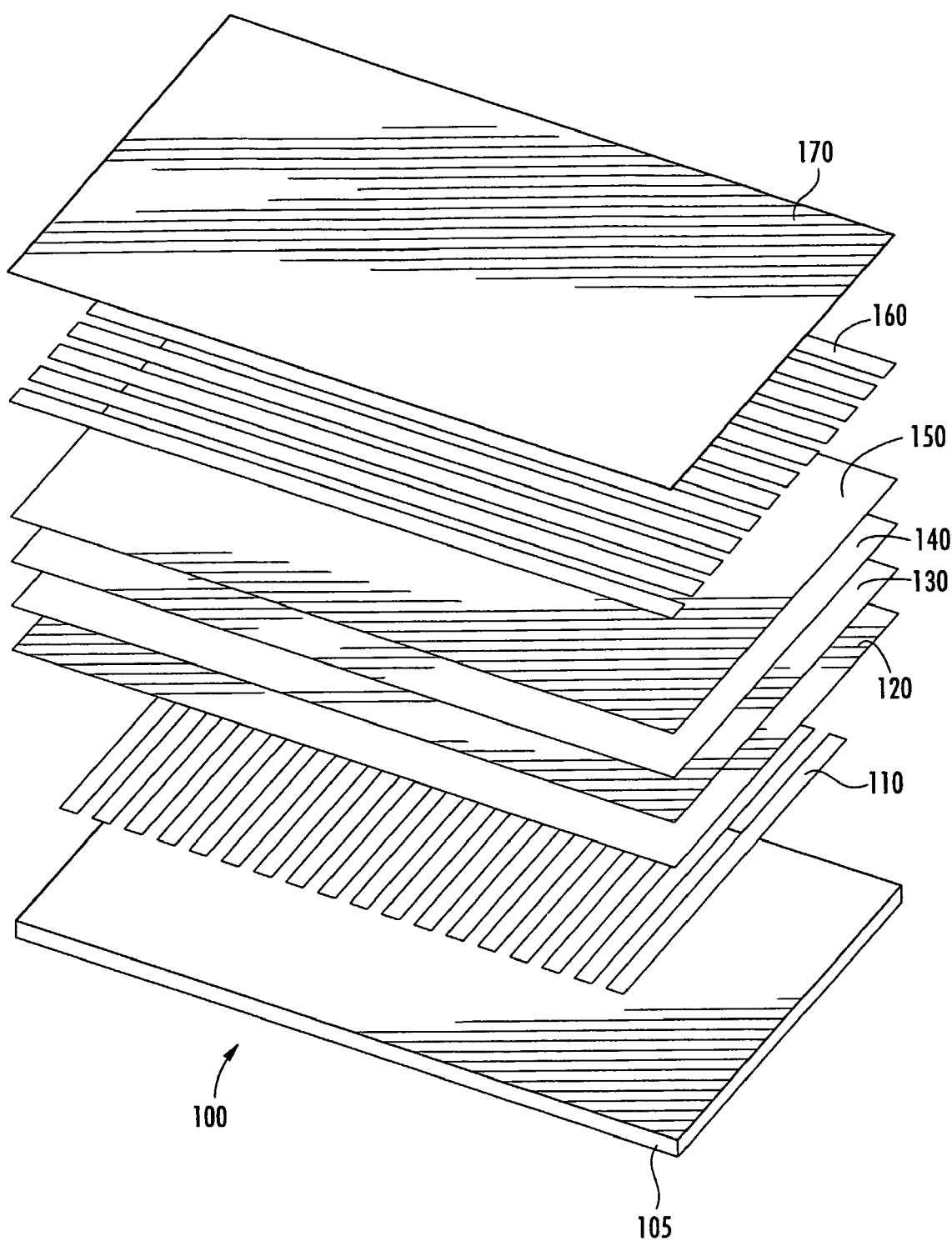
FIG. 3 is a schematic diagram of an organic electronic device.

Referring to FIG. 3, an exemplary organic electronic device 100 is shown. The device 100 includes a substrate 105. The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8, 10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in "Flexible Light-Emitting Diodes Made From Soluble Conducting Polymer," Nature, Vol. 357, pp 477 479 (11 Jun. 1992). At least one of the anode and cathode should be at least partially transparent to allow the generated light to be observed.

An optional buffer layer 120, such as hole transport materials, may be deposited over the anode layer 110, the latter being sometimes referred to as the "hole-injecting contact layer." Examples of hole transport materials suitable for use as the layer 120 have been summarized, for example, in Kirk Othmer Encyclopedia of Chemical Technology, Fourth Edition, Vol. 18, p. 837 860, 1996, by Y. Wang. Both hole transporting "small" molecules as well as oligomers and polymers may be used. Hole transporting molecules include, but are not limited to: N,N'diphenyl-N,N'-bis(3-methylphenyl)-[1,1'-biphenyl]-4,4'-diamine (TPD), 1,1 bis[(di-4-tolylamino)phenyl]cyclohexane (TAPC), N,N'bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), a-phenyl4-N,N-diphenylaminostyrene (TPS), p(diethylamino)benzaldehyde diphenylhydrazone (DEH), triphenylamine (TPA), bis[4(N,N-diethylamino)-2-methylphenyl](4-methylphenyl)methane (MPMP), 1phenyl-3-[p-(diethylamino)styryl]-5-[p-(diethylamino)phenyl]pyrazoline (PPR or DEASP), 1,2trans-bis (9H-carbazol-9-yl)cyclobutane (DCZB), N,N,N',N'tetrakis (4-methylphenyl)-(1,1'-biphenyl)-4,4'-diamine (TTB), and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

An organic layer 130 may be deposited over the buffer layer 120 when present, or over the first electrical contact layer 110. In some embodiments, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material (e.g., in layer 130). Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices of the invention, photoactive material can be an organometallic complex. In another embodiment, the photoactive material is a cyclometalated complex of iridium or platinum. Other useful photoactive materials may be employed as well. Complexes of Iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210.

A second electrical contact layer 160 is deposited on the organic layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing and other compounds, such as LiF and Li2O, may also be deposited between an organic layer and the cathode layer to lower the operating voltage of the system.

An electron transport layer 140 or electron injection layer 150 is optionally disposed adjacent to the cathode, the cathode being sometimes referred to as the "electron-injecting contact layer."

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be a layer (not shown) between the anode 110 and hole transport layer 120 to facilitate positive charge transport and/or band-gap matching of the layers, or to function as a protective layer. Other layers that are known in the art or otherwise may be used. In addition, any of the above-described layers may comprise two or more sub-layers or may form a laminar structure. Alternatively, some or all of anode layer 110 the hole transport layer 120, the electron transport layers 140 and 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layers 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices can be prepared employing a variety of techniques. These include, by way of non-limiting exemplification, vapor deposition techniques and liquid deposition. Devices may also be sub-assembled into separate articles of manufacture that can then be combined to form the device.

Other features and benefits of any one or more of the embodiments will be apparent from the following detailed description, and from the claims. Before addressing details of embodiments described below, some terms are defined or clarified.

Definitions

The term "containment structure" is intended to mean a structure overlying, or including a substrate, wherein the structure serves a principal function of separating an object, a region, or any combination thereof within or overlying the substrate from contacting a different object or different region within or overlying the substrate.

The term "inherent" refers to a property that is not a result of subsequent treatment. In the context of inherent surface energy of a layer, it refers to the surface energy of the layer after deposition and curing (if applicable), but without subsequent treatment. For example, a layer that has a surface energy as a result of fluorination no longer has an "inherent" surface energy as used in this specification.

The term "zone" is intended to mean a physical area on a layer or device.

The term "substrate" is intended to mean a workpiece that can be either rigid or flexible and may include one or more layers of one or more materials, which can include, but are not limited to, glass, polymer, metal, or ceramic materials, or combinations thereof.

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

EXAMPLES

The concepts described herein will be further described in the following examples, which do not limit the scope of the invention described in the claims.

Example 1

An Indium Tin Oxide (ITO) coated glass substrate has an inherent surface energy (E1). A first layer comprising a photoresist/additive formulation is deposited (i.e., coated, exposed, developed, baked, and cured) over the substrate to form a first zone having a surface energy (E2). A second layer comprising a photoresist/additive formulation is deposited (i.e., coated, exposed, developed, baked, and cured) over the first layer, to form a second zone having a different surface energy (E3). The substrate, and the first and second layers define a containment structure for receiving a liquid, where E2 is different from E3. E2 is selected such that it has a higher surface energy than E3.

Example 2

An Indium Tin Oxide (ITO) coated glass substrate has an inherent surface energy (E1). A first layer comprising a photoresist/additive formulation is deposited (i.e., resist coated) over the substrate to form a first zone having a surface energy (E2). A second layer comprising a photoresist/additive formulation is deposited (i.e., resist coated) over the first layer, to form a second zone having a different surface energy (E3). The substrate, and the first and second layers define a containment structure for receiving a liquid, where E2 is different from E3.

The entire structure is then exposed, developed, baked, and cured. As compared to Example 1, the process is streamlined to eliminate one masking step. Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

The invention claimed is:

1. A containment structure comprising a first zone having an inherent first surface energy, and a second zone having an inherent second surface energy which is different than the first surface energy;
wherein said first zone and said second zone correspond to separate layers, wherein the layers each comprise a photoresist and at least one of the layers comprises an additive selected from the group consisting of surfactants, fluoro-surfactants, silicones, and siloxanes mixed throughout the layer.

2. The containment structure of claim 1, wherein the respective surface energies of the zones differ by at least 10 dynes/cm.

3. The containment structure of claim 1, further comprising a substrate for defining the bottom of the containment structure, wherein the first zone is adjacent to the substrate.

4. An organic electronic device, comprising the containment structure of claim 1.

5. An article useful in the manufacture of an organic electronic device, comprising the containment structure of claim 1.

6. The containment structure of claim 1, wherein said layers create sides to the containment structure and said side creating said first zone has an angle different from said side creating said second zone.

7. The containment structure of claim 3, wherein the substrate is formed from Indium Tin Oxide coated glass.

8. The containment structure of claim 3, wherein a first layer is deposited on the substrate, and a second layer is deposited on the first layer.

9. The containment structure of claim 3, wherein the sum of the surface energies of the substrate and the first zone is different than the surface energy of the second zone.

10. The containment structure of claim 8, wherein the first layer is deposited on the substrate by coating, exposing, developing, baking, and curing, and the second layer is deposited on the first layer by coating, exposing, developing, baking, and curing.

11. The containment structure of claim 8, wherein the first layer is deposited on the substrate by resist coating, and the second layer is deposited on the first layer by resist coating.

12. The containment structure of claim 9, wherein the sum of the surface energies of the substrate and the first zone is greater than the surface energy of the second zone.

13. The containment structure of claim 9, wherein the surface energy of the first zone is greater than the surface energy of the second zone.

14. The containment structure of claim 6, wherein the average of the respective angles of the first zone and the second zone is from 35 degrees to 145 degrees.

* * * * *